United States Patent
Denes et al.

(10) Patent No.: US 7,723,126 B2
(45) Date of Patent: May 25, 2010

(54) PLASMA-ENHANCED FUNCTIONALIZATION OF INORGANIC OXIDE SURFACES

(75) Inventors: Ferencz S. Denes, Madison, WI (US); Sorin Odisei Manolache, Madison, WI (US); Jason M. Helgren, Madison, WI (US); Max G. Lagally, Madison, WI (US); Bradley James Larson, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 153 days.

(21) Appl. No.: 10/809,318

(22) Filed: Mar. 24, 2004

(65) Prior Publication Data
US 2010/0021654 A1    Jan. 28, 2010

(51) Int. Cl.
*G01N 33/545* (2006.01)
*G01N 33/552* (2006.01)
*G01N 33/553* (2006.01)
*G01N 33/554* (2006.01)
*C07C 217/50* (2006.01)

(52) U.S. Cl. ............... 436/525; 436/518; 436/524; 436/527; 436/528; 436/531

(58) Field of Classification Search ........... 436/525, 436/527, 528, 531
See application file for complete search history.

(56) References Cited

U.S. PATENT DOCUMENTS

| | | | |
|---|---|---|---|
| 2,164,248 A | 6/1939 | Lawrie et al. | |
| 2,559,986 A * | 7/1951 | Musser | 8/116.1 |
| 4,082,500 A | 4/1978 | Ward et al. | |
| 4,280,824 A * | 7/1981 | Lassmann et al. | 95/97 |
| 4,803,093 A * | 2/1989 | Ishihara et al. | 427/568 |
| 4,822,681 A * | 4/1989 | Schossler et al. | 428/405 |
| 5,080,924 A | 1/1992 | Kamel et al. | |
| 5,132,108 A | 7/1992 | Narayanan et al. | |
| 5,306,768 A | 4/1994 | Hsu et al. | |
| 5,336,518 A | 8/1994 | Narayanan et al. | |
| 5,486,580 A * | 1/1996 | Newsham et al. | 525/504 |
| 6,022,902 A | 2/2000 | Koontz | |
| 6,106,653 A | 8/2000 | Polizzotti et al. | |
| 6,159,531 A | 12/2000 | Dang et al. | |

(Continued)

FOREIGN PATENT DOCUMENTS

EP    0874242 A1    10/1998

(Continued)

OTHER PUBLICATIONS

Material Safety Data Sheet for Epichlorohydrin, MSDS No. E0925, Jan. 1, 1996, Mallinckrodt Baker, Inc., Phillipsburgn, NJ, pp. 1-9.*

(Continued)

*Primary Examiner*—Unsu Jung
(74) *Attorney, Agent, or Firm*—Whyte Hirschboeck Dudek S.C.

(57) ABSTRACT

Methods for producing plasma-treated, functionalized inorganic oxide surfaces are provided. The methods include the steps of subjecting an oxide surface to a plasma to create hydroxyl functionalities on the surface and reacting the hydroxyl functionalities with epoxy group-containing molecules in situ in the absence of plasma. Biomolecules may be immobilized on the resulting functionalized surfaces. The methods may be used to treat a variety of oxide surfaces, including glass, quartz, silica and metal oxides.

13 Claims, 8 Drawing Sheets

U.S. PATENT DOCUMENTS

| | | | |
|---|---|---|---|
| 6,306,506 | B1 | 10/2001 | Timmons et al. |
| 6,402,899 | B1 | 6/2002 | Denes et al. |
| 6,406,921 | B1* | 6/2002 | Wagner et al. ............... 436/518 |
| 6,506,594 | B1* | 1/2003 | Barany et al. ............ 435/287.2 |
| 6,528,264 | B1 | 3/2003 | Pal et al. |
| 6,602,692 | B1 | 8/2003 | Glusenkamp et al. |
| 6,630,358 | B1 | 10/2003 | Wagner et al. |
| 7,112,615 | B2* | 9/2006 | Gleason et al. ................ 521/77 |
| 2002/0110932 | A1* | 8/2002 | Wagner et al. ............... 436/518 |
| 2002/0128234 | A1* | 9/2002 | Hubbell et al. ............... 514/100 |
| 2003/0113478 | A1* | 6/2003 | Dang et al. .................. 427/535 |
| 2003/0163198 | A1 | 8/2003 | Morra et al. |
| 2003/0207099 | A1 | 11/2003 | Gillmor et al. |

FOREIGN PATENT DOCUMENTS

| | | |
|---|---|---|
| WO | WO 0183826 A2 * | 11/2001 |
| WO | WO 0196452 A2 * | 12/2001 |
| WO | WO 03083477 A2 * | 10/2003 |

OTHER PUBLICATIONS

Rasmussen, et al., "Covalent Immobilization of DNA into Polystyrene Microwells: The Molecules are only Bound at the 5' End," *Analytical Biochemistry*, 198, pp. 138-142, 1991, Published by Academic Press, Inc. 21.

Timofeev, et al., "Regioselective Immobilization of Short Oligonucleotides to Acryl Copolymer Gels," *Nucleic Acids Research*, 24, No. 16, pp. 3142-3148, 1996. Published by Oxford University Press.

Parinov, et al., "DNA Sequencing by Hybridization to Microchip Octa and Decanucleotides Extended by Stacked Pentanucleotides," *Nucleic Acids Research*, 24, No. 15, pp. 2998-3004, 1996. Published by Oxford University Press.

Proudnikov, et al., "Chemical Methods of DNA and RNA Fluorescent Labeling," *Nucleic Acids Research*, vol. 24, No. 22, pp. 4535-4542, 1996. Published by Oxford University Press.

Guschin, et al., "Manual Manufacturing of Oligonucleotide, DNA, and Protein Microchips," *Analytical Biochemistry*, 250, pp. 203-211, 1997. Published by Academic Press.

Fotin, et al., "Parallel Thermodynamic Analysis of Duplexes on Oligodeoxyribonucleotide Microchips," *Nucleic Acids Research*, 26, No. 6, pp. 1515-1521, 1998. Published by Oxford University Press.

Proudnikov, et al., "Immobilization of DNA in Polyacrylamide Gel for the Manufacture of DNA and DNA-Oligonucleotide Microchips," *Analytical Biochemistry* 259, pp. 34-41, 1998, Published by Academic Press.

Wang, et al., "Polishable and Renewable DNA Hybridization Biosensors," *Anal Chem*, 70, pp. 3699-3702, 1998, Published by the American Chemical Society.

Podyminogin, et al., "Attachment of Benzaldehyde-modified Oligodeoxynucleotide Probes to Semicarbazide-Coated Glass," *Nucleic Acids Research*, vol. 29, No. 24, pp. 5090-5098, 2001. Published by Oxford University Press.

Alvarez-Blanco, et al., "A Novel Plasma-enhanced Way for Surface-functionalization of Polymeric Substrates," *Polymer Bulletin*, 47, pp. 329-336, 2001. Published by Sprinter-Verlag.

Ivanova, et al., "Feasibility of Using Carboxylic-rich Polymeric Surfaces for the Covalent Binding of Oligonucleotides for microPCR Applications," *Smart Mater. Struct.*, 11, pp. 783-791, 2002. Published by Institute of Physics Publishing.

Metzger, et al., "Signal to Noise Comparison Accelr8 OptArray vs. The Leading Polymer and Silane Microarray Slide Chemistries," *Technical Bulletin*, No. TB0400, 2002.

Yang, et al., "DNA-modified Nanocrystalline Diamond Thin-films as Stable, Biologically Active Substrates," *Nature Materials*, 1, No. 4, pp. 253-257, 2002. Published by Nature Publishing Group.

Cheung, et al., "5'-Thiolated Oligonucleotides on (3-Mercaptopropyl) trimethoxysilaten-Mica: Surface Topography and Coverage," *Langmuir*, vol. 19, pp 5846-5850, 2003, published by American Chemical Society.

Liu, et al., "DNA Probe Attachment on Plastic Surfaces and Microfluidic Hybridization Array Channel Devices with Sample Oscillation," *Analytical Biochemistry* 317, pp. 76-84, 2003, Published by Academic Press.

"Motorola Goes for Organic Growth with Biochips," http://www.groupweb,com/sci_tech/jun_30/motorola.html Website article printed on Jan. 2, 2000.

Quan, "Motorola's Biochip Center Aims for a Healthier World," *EE Times*, Feb. 16, 1999, http://www.edtn.com/story/tech/OEG19990216S0030-R. Website article printed on Aug. 6, 2004.

"EasySpot Microarray Slide," http://www.u-vision-biotech.com/english/product_service/easy_oligo. Website article printed on Feb. 19, 2004.

"Novel surface chemistry for DNA Immobilization," http://hamers.chem.wisc.edu/research/bloattachment/dna_on_silicon.htm. Website article printed on Mar. 2, 2003.

"Motorola and Packard to produce 'biochips'" http://www4.nando.net/newsroom/ntn/health/062998/health7_12937_noframes.html. Website article printed on Jan. 2, 2000.

"*Biochip*," http://www.whatis.com/biochip.html. Website article printed on Jan. 2, 2000.

"New "Biochips" Aimed at Medicine, Agriculture," http://www.pcworld.com/pcwtoday/article/0,15410,7313,00.html. Website article printed on Jan. 2, 2000.

"*Microarray Substrates & Slides*," http://arrayit.com/Products.Substrates/. Website article printed on Aug. 9, 2004.

"*Super Epoxy Substrates*," http://arrayit.com/Products/Substrates/SME/sme.html. Website article printed on Aug. 6, 2004.

"Biomolecule Immobilization," http://www.surmodics.com/pareDetail.aspx?pageId=10&menuID=10, Website article printed on Feb. 19, 2004.

"Photolink Manufacturing Process,"http://www.surmodics.com/pageDetail.aspx?pageId=7&menuID=7, website article printed on Feb.19, 2004.

"A Specific Surface for a Specific Application," http://www/vwrcanlab.com, Website article printed prior to Mar. 24, 2004.

Denes, et al., "Mechanism of RF Plasma Induced Fragmentation of $SiCl_4$ and Surface Functionalization of Polymeric Substrates from $SiCl_x$ Species," Journal of Applied Polymer Science, 1996, vol. 61, pp. 845-884.

International Search Report dated Aug. 31, 2006 for PCT/US2005/006514.

W.C.J. Ross, "The Reactions of Certain Epoxides in Aqueous Solutions," *J. Chem. Soc.*, pp. 2257-2272 (1950).

G.N. Merrill, "The gas-phase reactivity of epichlorohydrin with hydroxide," *Journal of Physical Organic Chemistry* 17:241-248 (2004).

McKelvey, John B. et al, "Reaction of Epoxides with Cotton Cellulose in the Presence of Sodium Hydroxide." Textile Research Journal (1959) 29: 918-925.

Francis, Thomas et al, "The Base-Catalyzed Condensation of Cellulosic Fabrics with Volatile Epoxides."Textile research Journal(1963) 33:8 583-599.

Ferrante, Gerald R., "A Vapor-Phase Epichlorhydrin Process for Wet and Dry Wrinkle Recovery." Textile Research Journal (1965) 35:5 446-452.

McKelvey, John B. et al, "The Action of Epichlorohydrin in the Presence of Alkalies and Various Salts on the Crease Recovery of Cotton." Journal of Applied Polymer Science (1963) 7: 1371-1389.

McKelvey, John B. et al, "Reaction of Cotton Cellulose with Epoxides in the Presence of Acid Catalysts." American Dyestuff Reporter (1960) 49:22 19-24.

* cited by examiner

PLASMA-ENHANCED FUNCTIONALIZATION OF INORGANIC OXIDE SURFACES

STATEMENT OF GOVERNMENT RIGHTS

Research funding was provided for this invention by the Office of Naval Research (NAVY/ONR) under Grant Number N00014-02-1-0893. The federal government has certain rights in this invention.

FIELD OF THE INVENTION

This invention pertains generally to the field of plasma processing of materials and to the plasma-enhanced functionalization of oxide surfaces.

BACKGROUND OF THE INVENTION

Bioactive surfaces made from surface-bound biomolecules may be used in a variety of bioassays, biosensors and other devices. For example, polymer-bound oligonucleotides find applications in hybridization-based diagnostics and in the discovery of new therapeutics based on molecular recognition. Prenatal diagnostics of genetic aberrations, identification of virus born diseases, detection of mutations of regulatory proteins controlling carcinogenesis, and novel hybridization-based identification techniques oriented to forensic or archaeology fields are some of the potential applications.

Bioactive surfaces may also play an essential role in areas other than medicine, pharmaceutics and biotechnology. Development of ultra-selective chemical sensors and absorbent surfaces are crucial for creating environmentally safe processes. Monitoring the quality of water is one of the major demands in this area. Biomolecular-based chemical sensors and filters for toxic chemicals and microorganisms (e.g., E. coli) will play a significant role in future technologies.

Proteins, and enzymes in particular, are one class of biomolecules commonly used to make bioactive surfaces. The advantages of using enzymes in bioassays and biosensors are related to their very high specificity (regio- and stereo-specificity) and versatility, mild reaction conditions (close to room temperatures and to pH neutral media), and to their high reaction rates. However, due to the poor recovery yields and reusability of free enzymes, much attention has been paid in the last few years to the development of efficient enzyme immobilization processes. Most biologically-active in vivo species, such as enzymes and antibodies, function in heterogeneous media. These environments are difficult to reproduce in vitro for industrial utilization. Immobilized enzyme systems are useful for experimental and theoretical research purposes for understanding the mechanisms of in vivo, biocatalyzed reactions, and offer solutions for use in batch-type reactions, where there is poor adaptability to various technological designs and recovery of the enzymes is difficult.

The activity of enzymes (polypeptide molecules) are based on their complex three-dimensional structures containing sterically exposed, specific functionalities. The polypeptide chains are folded into one or several discrete units (domains), which represent the basic functional and three-dimensional structural entities. The cores of domains are composed of a combination of motifs which are combinations of secondary structure elements with a specific geometric arrangement. The molecular-structure-driven chain-folding mechanisms generate three-dimensional enzyme structures with protein molecules orienting their hydrophobic side chains toward the interior and exposing a hydrophilic surface. The —C(R)—CO—NH— based main chain is also organized into a secondary structure to neutralize its polar components through hydrogen bonds. These structural characteristics are extremely important and they make the enzyme molecules very sensitive to the morphological and functional characteristics of the potential immobilizing substrates. High surface-concentrations of enzyme-anchoring functionalities can result, for instance, in excessive enzyme-densities or multipoint connections which can "neutralize" the active sites or can alter the three-dimensional morphologies of the enzyme molecules through their mutual interaction and their interaction with the substrate surfaces. These are just a few of the factors which may be responsible for the significantly lower activities of immobilized-enzymes in comparison to the activities of free enzyme molecules. Rough substrate surface topographies or stereoregular surfaces (e.g., isotactic or syndiotactic polymers) might also influence, in a positive or negative way, the specific activities. Morphologically ordered surfaces might induce changes of the stereoregular shapes of protein molecules. It has also been found that enzymes can adopt more than one functional conformation other than its lowest potential energy state. E. S. Young et al., Anal. Chem. Vol. 69, 1977, pp. 4242, et seq.

A number of approaches have been proposed for immobilizing bioactive molecules, such as enzymes on inorganic substrates. One common approach is to use wet chemical techniques to functionalize a substrate surface and then to link the surface functionalities to free functional groups on a biomolecule through a linking molecule capable of forming covalent bonds to both. Unfortunately, these wet chemical techniques tend to be time-consuming, multi-step processes that involve the use of expensive and/or hazardous reagents.

Cold plasma processing has shown promise for the functionalization of inorganic substrates. Numerous experiments performed in recent years in plasma laboratories under various internal and external plasma conditions and reactor geometries clearly indicate that inert and reactive-gas discharges are effective for the surface modification (functionalization) of even the most inert materials, such as silica. The industrial applications of macromolecular plasma chemistry are rapidly developing. Large capacity reactors and continuous flow system plasma installations have been designed, developed and tested.

SUMMARY OF THE INVENTION

Low or atmospheric pressure RF-plasma-enhanced surface treatment methods for covalently bonding epoxy-functional spacer molecules and biomolecules to oxide surfaces are provided. The methods take advantage of plasma-generated surface hydroxyl functionalities on inorganic oxide surfaces, which can promote under in situ conditions, heterogeneous chemical reactions with stable gas-phase molecules in the absence of plasma.

Oxide surfaces treated using the methods provided herein may be fabricated with a higher density of bound biomolecules than similar surfaces fabricated using wet chemical techniques. The use of a plasma approach makes it possible to fabricate such surfaces with small quantities of starting materials, while avoiding many of the environmentally unfriendly chemicals that are typically employed in wet chemical techniques. This significantly enhances environmental safety while reducing costs. In addition, biosensors and assays made from the surfaces typically experience less non-specific binding than sensors and assays made using conventional wet chemistry approaches. As a result, devices made using the methods provided herein are more reliable and more sensitive than other similar devices presently available.

The methods provided herein are well suited for the production of substrates for molecular recognition and molecular manufacturing applications which require immobilized biomolecules. The enhanced sensitivity of the surfaces provided herein make them well-suited for use in a variety of applications, such as biochips and biosensors, including flexible, thin-film biosensors that can be integrated into traditional microelectronics. Specific examples of applications for which the surfaces may be used include hybridization assays, fluorescence assays and luminescence assays.

In accordance with the invention, hydroxyl functionalities are formed on oxide surfaces by exposing the surfaces to a cold plasma made from an appropriate plasma source gas, such as a water/oxygen source gas. Various oxide surfaces such as glass and silica surfaces and metal oxide surfaces may be efficiently functionalized in this manner. The hydroxyl terminated surfaces can then be used to initiate in situ gas phase derivatization reactions with epoxy-functional molecules to form spacer chains covalently attached to the substrate.

The gas phase reactions may be carried out within the same reactor to avoid exposure of the hydroxyl-functionalized surface to unwanted materials. After the plasma is terminated, the reaction chamber is evacuated to remove the plasma source gas and a gas containing epoxy-functional molecules is introduced into the chamber and exposed to the oxide surface. The epoxy-functional molecules then react with the surface hydroxyl groups to provide surface-bound spacer chains. The spacer chains so formed may be extended in one or more additional gas phase reactions carried out in multiple steps to provide an extended spacer chain of a desired length and structure.

These chains are available for binding to various other reactants, particularly biomolecules including enzymes and nucleotides. Using the methods provided herein, an enzyme may be bound to a substrate through a spacer chain, while retaining freedom of movement and conformation comparable to that of the free enzyme. In this manner, the activity of bioactive molecules such as enzymes and nucleotides can be significantly enhanced over that of such molecules bound directly to the substrate.

Further objects, features and advantages of the invention will be apparent from the following detailed description when taken in conjunction with the accompanying drawings.

DETAILED DESCRIPTION OF THE INVENTION

Figure 1:
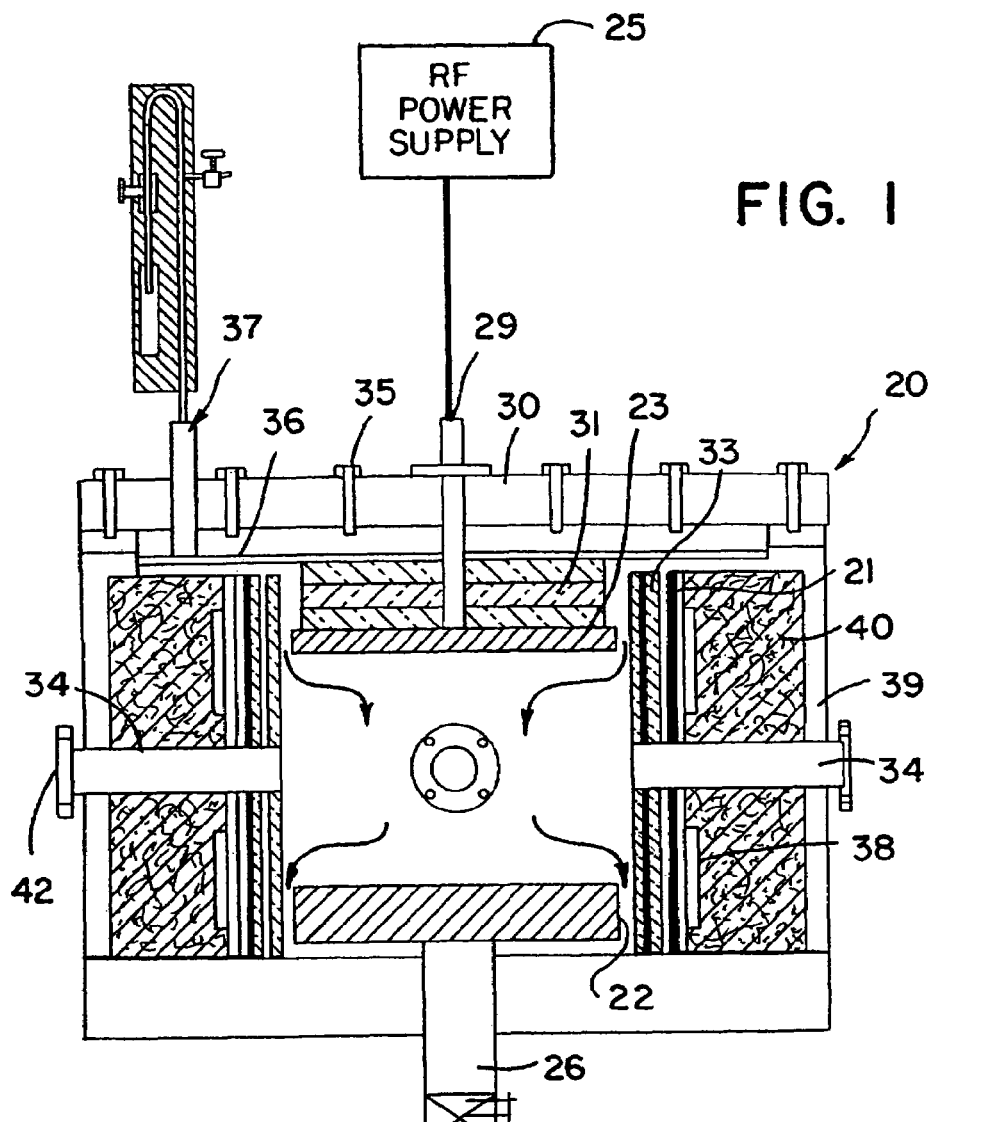
FIG. 1 shows a parallel plate reactor that may be used to carry out a surface plasma treatment in accordance with the present invention.

The intercalation of molecular spacer chains between oxide surfaces and biomolecules in accordance with the present invention is carried out utilizing cold plasma processing techniques for initial functionalization of the oxide surface of a substrate. Cold plasmas are non-thermal and non-equilibrium plasmas, as compared with hot plasmas which are thermal or equilibrium plasmas. In a cold plasma, the kinetic energy of the electrons is high while the kinetic energies of the atomic and molecular species are low.

In an initial step, one or more substrates may be subjected to a plasma cleaning in a plasma reactor chamber. This may be accomplished by igniting a plasma from an oxygen gas in the chamber for a time sufficient to remove contaminants from the substrate surfaces. This plasma cleaning step, which may take 30 minutes or less, is much faster than conventional wet chemical plasma cleaning techniques which typically require exposing a substrate to a caustic cleaning solution (e.g., piranha solution) overnight.

In the present invention, the substrate to be treated may be enclosed in a reaction chamber of the plasma reactor, a base pressure is established in the reactor, a plasma source gas is introduced into the reaction chamber and a cold plasma is ignited in the gas. The source gas may be any gas capable of producing a plasma that will produce an hydroxyl terminated substrate surface. The surface of the substrate is exposed to the cold plasma for a selected period of time sufficient to react the plasma with the substrate to provide surface hydroxyl groups. A water/oxygen plasma is one example of a plasma that may be used to produce hydroxyl groups on an inorganic oxide surface under in situ plasma environments. The resulting surface hydroxyl groups are extremely reactive toward epoxy groups.

The selection of appropriate plasma parameters for the creation of surface hydroxyl groups may depend on the specific design of the reactor and on the relative geometric positioning of the target or substrate holding electrode in the reactor chamber. The plasma is generally a low-pressure plasma, although atmospheric pressure plasmas may also be employed. Typical reactor conditions include a gas pressure of no more than about 400 mTorr, desirably no more than about 250 mTorr and a RF-power dissipated to the electrodes of no more than about 250 W, desirably no more than about 200 W. However, as one of skill in the art would recognize, reactor conditions outside these ranges may also be employed. Generally, only a relatively short exposure to the plasma discharge is needed. For example, in some embodiments of the surface treatment methods, the substrate is exposed to the plasma for no more than about 20 minutes. This includes embodiments where the substrate is exposed to the plasma for no more than about 10 minutes and further includes embodiments where the substrate is exposed to the plasma for no more than about 5 minutes.

A variety of gases may be used to produce the plasma discharge, provided the chosen gas is capable of creating hydroxyl functionalities on the substrate surface under plasma conditions. Typically, the gas will contain oxygen, water vapor or a mixture thereof. However, other gases, such as hydrogen or inert gases may also be present.

Alternatively, the hydroxyl functionalities may be made in a multi-step plasma/gas phase reaction treatment. In the first step, the surface is exposed to a plasma discharge capable of predisposing the surface to hydroxyl group formation. In a subsequent step, the surface is exposed in situ to a gas capable of creating surface hydroxyl functionalities in the absence of plasma. For example, a silica or glass substrate may first be exposed to a chlorine-containing plasma under conditions that promote implantation of silicon-chlorine functionalities into the substrate surface. Such plasmas include, but are not limited to, cold plasmas ignited from dichlorosilane, silicon tetrachloride, hexachlorodisilane and mixtures thereof. This may be accomplished according to the methods described in U.S. Pat. No. 6,402,899, the entire disclosure of which is incorporated herein by reference. In a subsequent step, the resulting surface silicon-chlorine functionalities are exposed to a source gas containing water, $O_2$, or a mixture thereof to convert the silicon-chlorine functionalities into silicon-hydroxyl functionalities. This may be accomplished by exposing the silicon-chlorine functionalities to atmospheric moisture.

For exemplification, the present invention is described utilizing plasmas formed from a plasma source gas containing water and oxygen.

In one embodiment of the methods provided herein, RF excitation, (e.g., 40 kHz and pulsed and CW 13.56 MHz), of a water/oxygen mixture in a cold-plasma, results in plasma-induced surface termination with hydroxyl groups on inorganic oxide surfaces. Inorganic oxide surfaces that may be treated in accordance with the methods provided herein include, but are not limited to, surfaces composed of silicon oxides, such as silica, glass and quartz surface, and metal oxide surfaces, such as the native chrome oxide present on stainless steel surfaces.

An example of a preferred parallel plate reactor provided with temperature control capabilities that can be utilized for plasma treatment in accordance with the invention is shown at 20 in FIG. 1. The reactor 20 is provided with heating capabilities (in the range of 25-500° C.) for the reaction chamber, the plasma source gas reservoir, and the connecting stainless steel supply line. The reactor is composed of a cylindrical stainless steel reaction chamber 21 in which a 20 cm diameter and a 0.8 cm thick lower, grounded electrode 22 and an (identical dimensions) upper, stainless steel electrode 23 are located. The upper electrode 23 is connected to a conventional RF-power supply 25. Conventional power supplies are available at 40 kHz and 13.56 MHz (operable CW or pulsed). Typically, the MHz and kHz power supplies are separate units. Both electrodes are preferably removable, which facilitates post-plasma cleaning operations. The lower electrode 22 is also a part of the vacuum line 26 through supporting conically shaped and circularly-perforated stainless steel tubing. The evacuation of the chamber 21 is performed uniformly through the narrow gap (3 mm) existing between the lower electrode 22 and the bottom of the reaction chamber. The upper electrode 23 is directly connected to the threaded end of the vacuum-tight metal/ceramic feedthrough 29 which assures both the insulation of the RF-power line from the reactor and the dissipation of the RF-power to the electrodes. The space between the upper electrode and the upper wall 30 of the reaction chamber is occupied by three 1 cm thick and 20 cm diameter Pyrex-glass removable disks 31. These discs insulate the electrode from the stainless steel top of the reactor and allow adjustment of the electrode to electrode gap. The reactor volume located outside of the perimeter of the electrodes is occupied by two Pyrex-glass cylinders 33 provided with four symmetrically located through-holes 34 for diagnostic purposes. This reactor configuration substantially eliminates the non-plasma zones of the gas environment and reduces considerably the radial diffusion of the plasma species, leading consequently to a more uniform plasma-exposure of the substrates being treated. As a result, uniform surface treatments can be achieved. The removable top of the reactor allows the reaction chamber to be vacuum sealed with the aid of a copper gasket and fastening bolts 35. This part of the reactor also accommodates a narrow circular gas-mixing chamber 36 provided with a shower-type, 0.5 mm diameter orifices system, and with a gas supply connection 37. This gas supply configuration assures a uniform penetration and flow of the gases and vapors through the reaction zone. The entire reactor chamber can be heated with electric heaters 38 attached to the outside surface of the chamber. The reactor chamber is enclosed in an aluminum-sheet 39 which protects a glass-wool blanket 40 that surrounds the sides of the reactor chamber to reduce thermal energy loss. Four symmetrically positioned stainless steel porthole tubes pass through the insulating blanket and are connected and welded to the reactor wall for diagnostic purposes. These portholes are provided with exchangeable, optically smooth, quartz windows 42.

Figure 2:
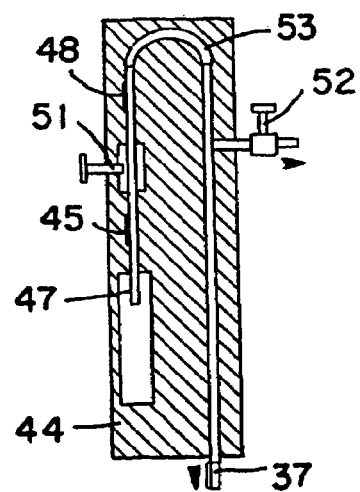
FIG. 2 shows the gas reservoir, valve and connecting tubing of the reactor of FIG. 1.
Figure 3:
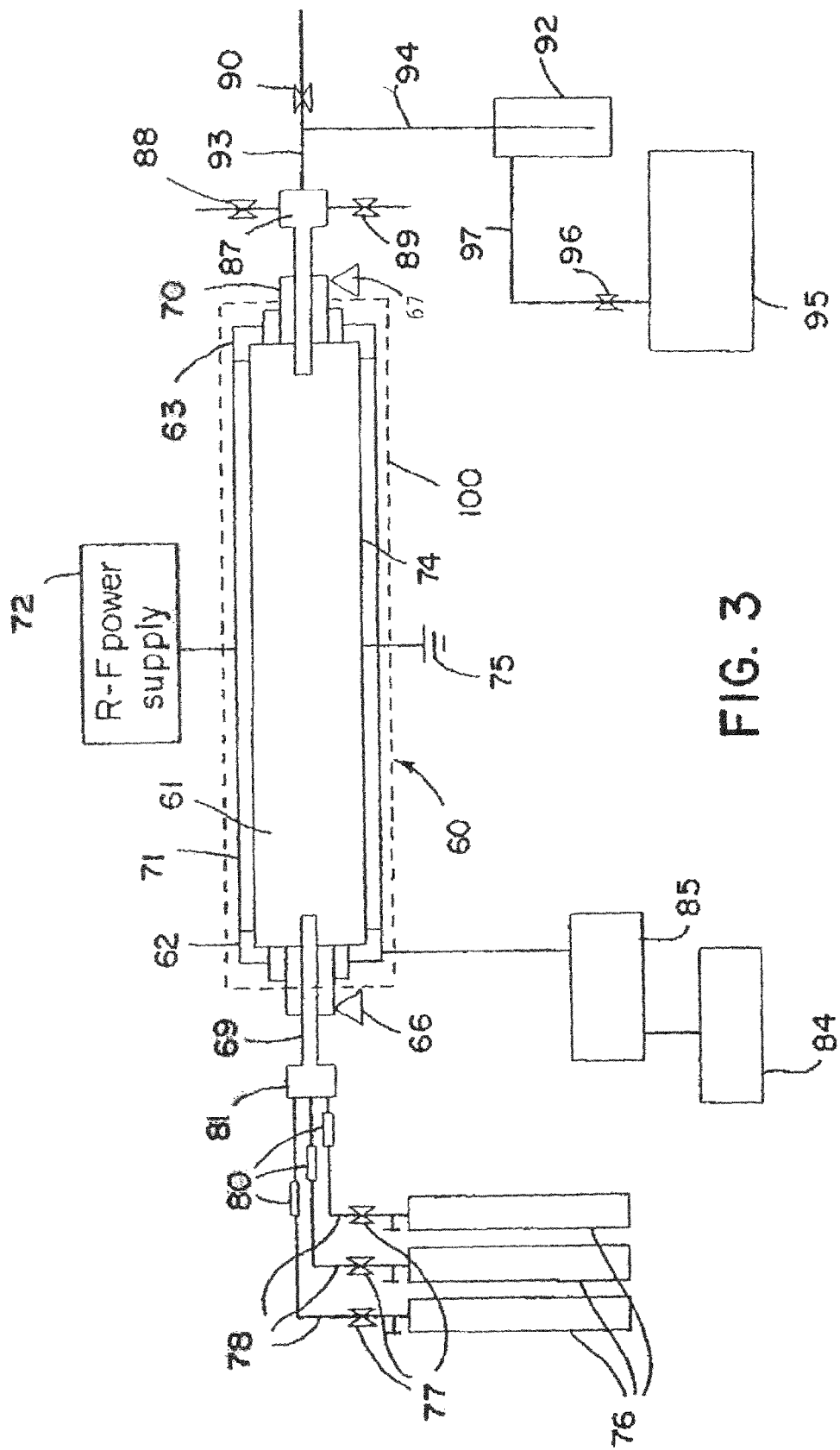
FIG. 3 shows a rotary reactor that may be used to carry out a surface plasma treatment in accordance with the present invention.

The plasma source gas reservoir, valve and the connecting stainless steel tubing are shown in greater detail in FIG. 2 and, as shown, are embedded in two shape-designed, 1 cm thick copper jackets 44 provided with controlled electric heaters 45, for processing low-volatility chemicals. The vapor supply assemblage is composed of a reservoir 47, VCR connectors 48, needle valves 51 and 52, and connecting tubing 53. The entire system is insulated using a glass-wool blanket coating.

The reactor 20 thus may be utilized to control the temperature of the reactor chamber and the substrate to achieve desired plasma operating conditions. Inductively coupled plasma reactors and other closed reactors may be utilized as well as corona discharge devices, examples of which are discussed below.

An exemplary cold plasma rotary reactor system which may be utilized to carry out the invention is shown generally at 60. Such a rotary system is especially well suited to the plasma treatment of fibers, powders and other particulate matter. The reactor system includes a cylindrical reaction vessel 61 (e.g., formed of Pyrex7 glass, 1 m long and 10 cm inside diameter) which is closed at its two ends by disk shaped stainless steel sealing assemblies 62 and 63. The end assemblies 62 and 63 are mounted to mechanical support bearings 66 and 67 which engage the sealing assemblies 62 and 63 to enable rotation of the reaction vessel 61 about its central axis, i.e., the central axis of the cylindrical reaction vessel. Hollow shaft (e.g., 0.5" inside diameter) ferrofluidic feedthroughs 69 and 70 extend through the sealing assemblies 62 and 63, respectively, to enable introduction of gas into and exit of gas from the reaction chamber. A semicylindrical, outside located, copper upper electrode 71 is connected to an RF power supply 72, and a lower, similar semicylindrical copper electrode 74 is connected to ground (illustrated at 75). The two electrodes 71 and 74 closely conform to the cylindrical exterior of the reaction vessel 61 and are spaced slightly therefrom, and together extend over most of the outer periphery of the reaction vessel but are spaced from each other at their edges a sufficient distance to prevent arcing or discharge between the two electrodes.

The source gas is held in containers 76, e.g., storage tanks. The flow of gas from a container 76 is controlled by needle valves 77 which may be manually or automatically operated. The gas that passes through the needle valves 77 is conveyed along supply lines 78 through flow rate controllers 80 to a gas mixing chamber 81 (e.g., preferably of stainless steel), and an MKS pressure gauge (e.g., Baratron) may be connected to the mixing chamber 81 to monitor the pressure thereof. The mixing chamber 81 is connected to the feedthrough 69 that leads into the interior of the reaction chamber 61. A digital controller 84 controls a driver motor 85 that is connected to the assembly 62 to provide controlled driving of the reaction chamber in rotation.

The second feedthrough 70 is connected to an exhaust chamber 87 to which are connected selectively openable exhaust valves 88, 89 and 90, which may be connected to conduits for exhaust to the atmosphere or to appropriate recovery systems or other disposal routes of the exhaust gases. A liquid nitrogen trap 92 is connected to an exhaust line 93 which extends from the chamber 87 by stainless steel tubing 94. The trap 92 may be formed, e.g., of stainless steel (25 mm inside diameter). A mechanical pump 95 is connected through a large cross-section valve 96 via a tube 97 to the trap 92 to selectively provide vacuum draw on the reactor system to evacuate the interior of the reaction chamber 61 to a selected level.

The power supply 72 is preferably an RF power supply (e.g., 13.56 MHz, 1,000 W) which, when activated, provides RF power between the electrodes 71 and 74 to capacitively couple RF power to the gas in the reaction chamber within the reaction vessel 61. Conventional coils for inductively coupling RF power to the plasma may also be used (e.g., a coil extending around the reaction vessel 61). A Farraday cage 100 is preferably mounted around the exterior of the reaction vessel to provide RF shielding and to prevent accidental physical contact with the electrodes.

The reactor vessel may be rotated by the drive motor 85 at various selected rotational speeds (e.g., 30-200 rpm), and it is preferred that the vacuum pump and associated connections allow the pressure in the reaction chamber within the vessel to be selectively reduced down to 30 mT.

The following are examples of commercial parts that may be incorporated in the system 60: RF-power supply 85 (Plasma Therm Inc. RTE 73, Kresson N.J. 08053; AMNS-3000 E; AMNPS-1); mechanical vacuum pump 95 (Leibold-Heraeus/Vacuum Prod. Inc., Model: D30AC, Spectra Vac Inc); pressure gauge (MKS Baratron, Model: 622A01TAE); digitally controlled rotating system 84, 85 (DC motor Model 4Z528, Dayton Electric Mfg. Co.; DART Controls Inc. controller).

In utilization of the plasma treatment system 60 in accordance with the invention, it is generally preferred to carry out a plasma-enhanced cleaning of the reactor prior to treatment to eliminate possible contaminants. An exemplary cleaning step includes introduction of oxygen gas from one of the tanks 76 into the reaction chamber and ignition of a plasma in the gas at, e.g., a power level of 300 W, a gas pressure of 250 mT, an oxygen flow rate of 6 sccm, and a typical cleaning period of 15 minutes.

In a typical treatment a substrate having an inorganic oxide surface is mounted in the plasma chamber, the system is closed and the base pressure is created. The rotation of the reactor is started at the selected speed and the system is kept under these conditions for 30 minutes in order to complete the gas- and moisture-desorption from the substrate surface. In the next step the selected plasma source gas flow and pressure conditions are established, and the plasma is ignited and sustained for the desired treatment time. At the end of the surface plasma treatment, the system may be evacuated to base pressure and re-pressurized with an epoxy-functional precursor gas, without breaking the vacuum, for a time sufficient to allow the precursor gas molecules to react with the surface hydroxyl functionalities to provide spacer molecules covalently bonded to the surface.

Plasma treatments are preferably preceded by a decontamination procedure of the reactor by igniting oxygen and argon plasmas successively (RF power: 200 W; pressure: 250 mT; flow rate gases: 6 sccm; plasma exposure time: 10 minutes).

The hydroxyl surface functionalities can then be utilized to initiate second stage, in situ, gas phase derivatization reactions with epoxy-functional molecules to form molecular spacer chains attached to the substrate. As used herein, the phrase "in situ" means without first breaking the vacuum in the plasma reactor chamber or otherwise exposing the surface to the atmosphere. This may be accomplished as follows: after the surfaces have been hydroxyl-functionalized, the reaction chamber is evacuated to remove the plasma source gas, and a gas containing epoxy group-containing molecules is introduced into the chamber in the absence of plasma to react with the surface hydroxyl functionalities, thereby forming epoxy-terminated spacer chains covalently bound to the surface. The necessary exposure time is typically quite short. In some embodiments, the surface hydroxyl groups are exposed to the gas for no more than about 30 minutes. This includes embodiments where the hydroxyl groups are exposed to the gas for no more than about 20 minutes and further includes embodiments where the hydroxyl groups are exposed to the gas for no more than about 10 minutes. The epoxy group-containing molecules typically have a reasonably high vapor pressure at room temperature, desirably, but not necessarily, at least about 200 mTorr.

The epoxy group-containing molecules are desirably heterobifunctional molecules having at least one functional group capable of reacting with a surface hydroxyl group to form a covalent bond and at least one epoxy group for reacting with an amine-functionalized or amine-containing biomolecule or an amine-functionalized or amine-containing spacer molecule to form a covalent bond. In the former embodiment, the surface-bound epoxy group-containing molecule provides a spacer chain attaching a biomolecule to the underlying surface. In the latter embodiment, the surface-bound epoxy group-containing molecule and the spacer molecule provide an extended spacer chain through which a biomolecule may be attached to the underlying surface. Epihalohydrins, such as epichlorohydrin molecules, are an example of suitable epoxy group-containing molecules. Analogs of epichlorohydrin, such as epibromohydrin and epifluorohydrin, may also be used. Diepoxides, such as 1,4-butanediol diglycidyl ether, are yet another example of epoxy group-containing molecules that may be employed.

The spacer molecules are characterized in that they include a first functional group, such as an amine group, capable of reacting with the epoxy group of the epoxy group-containing molecules and a second functional group capable of reacting with a functional group on another spacer molecule or on a biomolecule. The first and second functional groups may be the same or different. Like the epoxy group-containing molecules, the spacer molecules desirably have a reasonably high vapor pressure at room temperature. The spacer molecules are typically low molecular weight (e.g., Mw~500 or less) organic molecules containing between 2 and 20 carbon atoms.

Multiple sequential spacer chain extension steps may be used to tailor the length of the spacer chains. In each of these steps the surface-bound spacer chains undergo in situ gas-phase reactions with additional spacer chain molecules, in the absence of plasma, to become covalently bound to the existing spacer chains. After each step, the non-reacted components are evacuated from the reaction chamber. In this embodiment the spacer molecules are characterized in that they include a first functional group capable of reacting with a functional group on the existing spacer chains and a second functional group capable of reacting with another spacer molecule or with a biomolecule. The first and second functional groups may be the same or different. In this manner, chains of spacer molecules of a desired length can be built up. The terminal spacer molecules in the chains may then be exposed to a biomolecule to which it will bond, thereby providing active biomolecules bound to the substrate surface. Long spacer chains may be built up in a step-wise fashion to produce spacer chains longer than those provided using wet chemical methods. For example, in some embodiments the spacers chains may be at least 2.5 nm in length, where the length of the chain is calculated from the bond lengths between the atoms making up the chain. This includes embodiments where the spacer chains are at least 3 nm in length, further includes embodiments where the spacer chains are at least 3.5 nm in length, still further includes embodiments where the spacer chains are at least 4 nm in length and even further includes embodiments where the spacer chains are at least 5 nm in length.

Thus, from the discussion above, it should be understood that the term "spacer chain" may refer to a single epoxy-functional spacer molecule that has reacted with both a surface and a biomolecule to tether the biomolecule to the surface or a chain made from two of more spacer molecules wherein the terminal spacer molecule on one end of the chain is covalently bound to a surface, the terminal spacer molecule on the opposite end of the chain is covalently bound to a biomolecule and any intervening spacer molecules serve to increase the separation between the surface and the biomolecule. As used herein, the term "spacer chain" does not include any molecular chains or functionalities associated with a biomolecule prior to the reaction of that biomolecule with the surface-bound spacer chains.

The ability to extend and tailor the length of the spacer chains is particularly advantageous because longer spacer chains intercalated between a substrate surface and an immobilized bioactive molecule (e.g., an enzyme) can enhance significantly the activity of the immobilized biomolecule. In some instance, enzyme activities that are comparable to that of the free enzyme can be achieved by the extended spacer chains provided herein.

Thus, the present invention carries out the formation of the spacer chains in an in situ manner, (e.g., with the spacer chains built up under vacuum conditions without removing the substrates from the plasma reactor). The process provides a step-by-step gas phase reaction. After each step, the nonreacted components are evacuated from the reaction chamber. The nature and the length of the spacer chains can be controlled by the number of steps and by selecting the specific chain components. The process of the present invention has the particular advantage that it does not require any chemicals in addition to the spacer chain building-block molecules, in contrast to wet chemistry technologies which require complex mixtures of chemicals for the development of spacer chains.

The first and second functional groups on the spacer molecules may be the same or different. The exact nature of these functional groups will depend on the functionalities present on the other spacer molecules or biomolecules to which the spacer molecules are to be bound. Suitable functional groups include, but are not limited to, amine groups, epoxy groups, aldehyde groups, hydroxyl groups, carboxy groups and mercapto groups. Examples of suitable spacer molecules include, but are not limited to, diamine molecules, dialdehyde molecules, such as glutaric dialdehyde, anhydride molecules, such as hexafluoroglutaric anhydride molecules, epihalohydrin molecules, diepoxide molecules, such as 1,4-butanediol diglycidyl ether and dichlorosilanes, such as dimethyldichlorosilane. Molecules having chloracid groups may also be employed as spacer molecules. The chloracid groups on these molecules react readily with primary amine groups on other spacer molecules and amine-containing biomolecules. However, it has been shown that the chloracid groups on such molecules are extremely reactive with atmospheric moisture and may be quickly deactivated before they have the opportunity to undergo reaction with amine-containing biomolecules, unless precautions are taken to avoid exposure of the chloracid groups to the atmosphere. See S. Alvarez-Blanco, et al., Polymer Bulletin, Vol. 47, 2001, pp. 329-336. Therefore, for many applications, less reactive terminal spacer molecule functionalities are recommended.

After the spacer chains have been generated on the oxide surface, biomolecules may be immobilized on the surface by reacting the biomolecules with reactive functionalities on the spacer chains to form covalent bonds between the biomolecules and the spacer chains. This may be accomplished by venting the reactor chamber to bring it up to atmospheric pressure and reacting the biomolecules with the spacer chains using any suitable reaction scheme, including wet chemistries. As a result, active biomolecules, such as enzymes, may be bound to the oxide surface while allowing freedom of movement and conformation comparable to that of the free biomolecule.

One important advantage realized by the plasma-enhanced surface treatments provided herein is that they are capable of providing a higher spacer chain density on oxide surfaces than wet chemical approaches. This, in turn, provides for a higher density of surface-bound biomolecules. For example, using the methods provided herein oxide surfaces having a density of bound DNA molecules of at least about $1\times10^{12}$ DNA molecules/cm$^2$ and even at least about $2\times10^{12}$ DNA molecules/cm$^2$ may be produced.

In some embodiments the biomolecules may be thiol-terminated or thiol-containing biomolecules or phosphate-terminated or phosphate-containing biomolecules and the spacer chains include functional groups that react with thiol or phosphate groups to form covalent bonds. In other embodiments, the biomolecules are amine-terminated or amine-containing biomolecules and the spacer chains include functional groups that react with amine groups to form covalent bonds. The use of amine groups is advantageous because amine-based chemistries are less expensive to carry out and more stable than thiol-based chemistries.

Proteins are examples of biomolecules that may be usefully immobilized on the substrate surfaces. Other examples include oligonucleotides, aptamers, cDNA or RNA molecules. Still other examples include, but are not limited to, polypeptides, protein fragments, membrane proteins, receptor fragments, antibodies, antigens and enzymes.

The biomolecules may be immobilized on the surface-bound epoxy group-containing molecules or spacer chains using conventional methods, including known wet chemical methods. Generally, this step entails contacting the surface-bound chains with an aqueous solution of a selected biomolecule (e.g., protein). For example, the surface may be suspended in an aqueous protein solution with optional incubation and stirring. As one of skill in the art will recognize, the reaction conditions (e.g., temperature, pH, and exposure time) will depend on the particular system. Finally, the substrates may be rinsed with an appropriate solvent or buffer solution to remove unbound biomolecules.

After the biomolecules have been attached to the surface, any epoxy groups that have not bound biomolecules may be deactivated by exposing the surface to a 98% solution of ethanolamine for approximately 30 minutes. Alternatively, the epoxy groups may be deactivated by flowing a solution of bovine serum albumin (BSA) over the surface. The BSA attaches to any exposed epoxy groups and blocks further binding. Epoxy group deactivation is particularly helpful when the surfaces are used in a fluorescence assay because it reduces background fluorescence by reducing non-specific attachment of analyte biomolecules.

The methods provided herein may be used to functionalize and attach biomolecules to a wide variety of oxide surfaces. For example, the methods may be used to treat surfaces composed of silicon oxides, such as silica, glass and quartz. Such surfaces may be used in fluorescence assays by exposing the surfaces to analyte biomolecules labeled with fluorophores and subsequently collecting the fluorescence spectra to analyze the binding or hydridization between the surface bound biomolecules of the substrates and the analyte biomolecules. Alternatively, the methods may be used to treat surfaces composed of metal oxides, including aluminum oxides, titanium oxides and the native oxides of stainless steel, such as chromium oxide and iron oxide. The attachment of large biomolecules, such as proteins, to stainless steel surfaces in accordance with the plasma-enhanced treatments provided herein has useful applications in matrix-assisted laser desorption ionization (MALDI) spectrometry where the surfaces may be used as targets.

EXAMPLES

Materials and Methods: Unless otherwise specified, the following materials, equipment and methods were used in the examples below.

High purity argon and oxygen, employed to minimize the contamination of the reactor and, in the case of oxygen, as a plasma source gas were obtained from Liquid Carbonic (Oak Brook, Ill.). Epichlorohydrin and ethylenediamine, used for the surface functionalization reactions, were purchased from Aldrich Co. (St. Louis, Mo.). Fluorescamine was purchased from Molecular Probes Inc., (Eugene, Oreg.).

The DNA used in the experiments was composed of oligonucleotides 16 bases long with a C6-amino modifier on the 5' end and a fluorescein modifier on the 3' end. The sequence of the oligonucleotides, from the 5' end to the 3' end, was amino-C6-CG AAC CTT CCT TAA GC-fluorescein. These oligonucleotides were synthesized by the University of Wisconsin Biotechnology Center using a commercial DNA synthesizer. The amine-containing oligonucleotides can be stored for extended periods of time (e.g., months or longer) in a freezer or refrigerator without degrading and require no lengthy purification steps before use. Deionized water was used to dilute the oligonucleotides to a usable concentration.

The water/oxygen plasma treatment of the oxide surfaces was carried out in a cylindrical stainless steel, capacitively coupled (disc-shaped stainless steel electrodes; electrode diameter: 20 cm; gap: 3 cm), RF-plasma-reactor, equipped with a 40 kHz power supply with pulsing capability, as shown in FIG. 1.

The measurements of attached oligonucleotides took place using a high resolution GeneTAC microarray fluorescence scanner (Genomics Solutions) normally used for analyzing standard glass slides. Fluorescence images were obtained after multiple washes of the treated surfaces and several days in a deionized water bath.

Example 1

Attachment of DNA to a Glass Surface

Materials and Methods:

Glass slides obtained from Fisher Scientific (Pittsburgh, Pa.) were subjected to a water/oxygen plasma treatment under the following experimental conditions: Pressure of water and oxygen: 200 mTorr; RF-power dissipated to the electrodes: 200 W; Exposure time: 5 minutes. After the plasma treatment, the RF plasma chamber was pumped down to remove leftover reactive species.

Without breaking vacuum, covalent attachment of the epichlorohydrin molecules was performed by introducing the epichlorohydrin vapors over the plasma-treated surface under vacuum (pressure of epichlorohydrin: 1 Torr; reaction time: 30 minutes). After this step, the remaining epichlorohydrin was vented and the chamber pressure brought up to atmosphere.

The deposition of the oligonucleotides onto the surface was done using the fluid dispensation apparatus described in Rev. Sci. Instru., 75, 832 (2004) and in U.S. patent application Ser. No. 10/271,250, the entire disclosures of which are incorporated herein by reference. Briefly, a glass capillary having an interior diameter of approximately 1-100 micron and a piezoelectric actuator coupled to a portion of its circumference was dipped into a 200 µM solution of the above-described DNA molecules in water and a quantity of the solution was pulled into the capillary by capillary action. The glass substrate was disposed below the capillary on a substrate mount. Controlled by a positioning stage, the capillary was placed in contact with the substrate. The piezoelectric actuator was then activated at a frequency of 660 kHz with a voltage of 1 volt (peak-to-peak) for about 250 milliseconds to deposit a spot of solution from the capillary onto the surface of the substrate. The capillary was then moved relative to the substrate mount and the process was repeated to provide a triangular pattern and a rectangular pattern of spots on the substrate. The samples were allowed to react in a dark, dry environment for 2 hours. They were then washed to remove unbound oligonucleotides.

Figure 4:
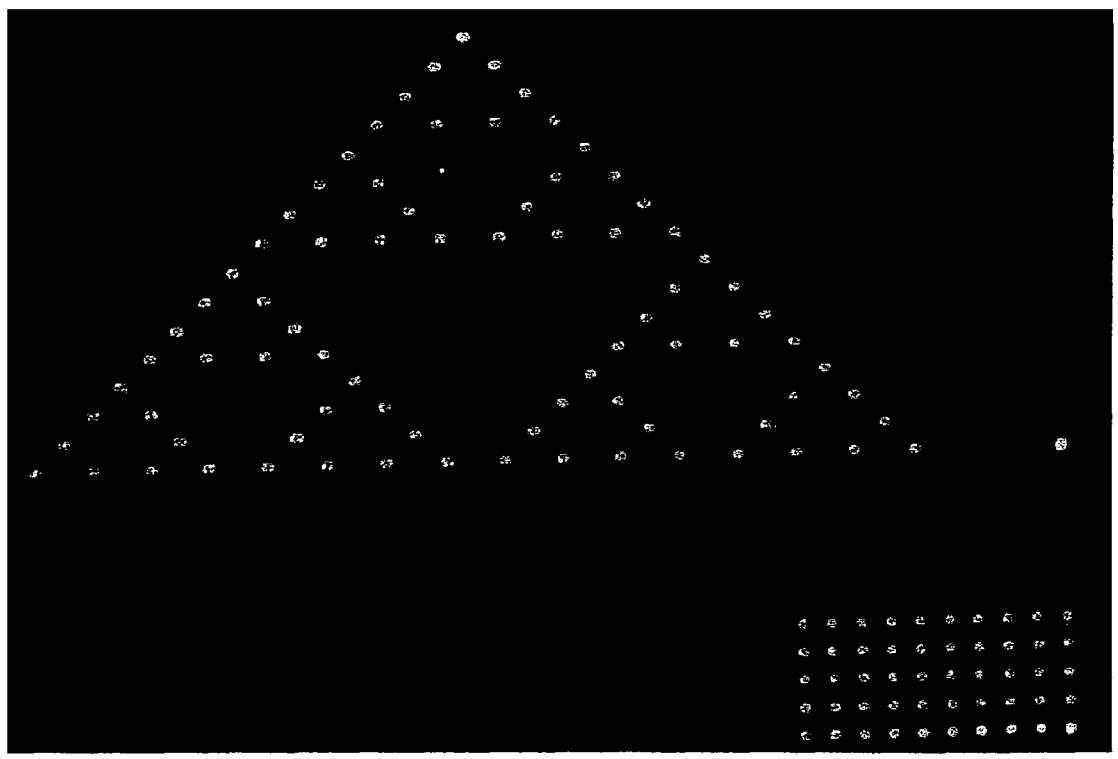
FIG. 4 shows a fluorescence image of fluorescently-tagged oligonucleotides immobilized on a glass slide.

Results:

A scan of the treated glass surface is presented below in FIG. 4. In the figure, the fluorescence spots corresponding to immobilized amine-terminated oligonucleotides in a triangular pattern (upper left) and a rectangular pattern (lower right) are clearly visible.

Example 2

Attachment of DNA to a Stainless Steel Surface

Materials and Methods:

Three stainless steel samples with a native oxide on their surfaces were subjected to a water/oxygen plasma treatment under the following experimental conditions: Pressure of water and oxygen: 200 mTorr; RF-power dissipated to the electrodes: 200 W; Exposure time: 5 minutes. After the plasma treatment, the RF plasma chamber was pumped down to remove leftover reactive species.

Without breaking vacuum, covalent attachment of the epichlorohydrin molecules was performed by introducing the epichlorohydrin vapors over the plasma-treated surface under vacuum (pressure of epichlorohydrin: 1 Torr; reaction time: 30 minutes). After this step, the remaining epichlorohydrin was vented and the chamber pressure brought up to atmosphere.

The deposition of the oligonucleotides onto the surfaces was done using an Eppendorf hand pipette capable of depositing 0.5 microliter spots. The oxidized stainless steel surfaces were each spotted in five places using the amine-terminated oligonucleotides. The samples were allowed to react in a dark, dry environment for 2 hours. They were then washed to remove unbound oligonucleotides.

Figure 5:
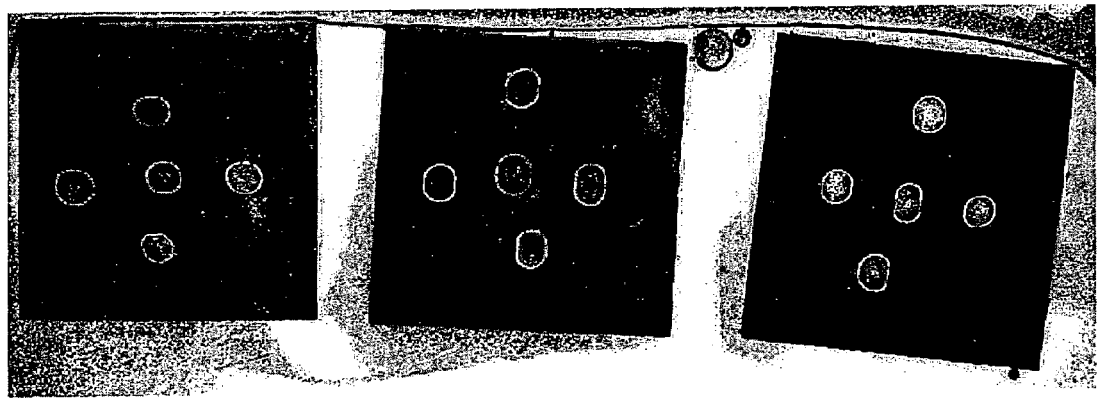
FIG. 5 shows a fluorescence image of fluorescently-tagged oligonucleotides immobilized on the chrome oxide present on pieces of stainless steel.

Results:

Scans of the treated stainless steel surfaces are presented below in FIG. 5. In the figure, the fluorescence spots corresponding to immobilized amine-terminated oligonucleotides are clearly visible with no visible fluorescence background.

Example 3

Attachment of DNA to a Quartz Surface

Materials and Methods:

A quartz slide was subjected to a water/oxygen plasma treatment under the following experimental conditions: Pressure of water and oxygen: 200 mTorr; RF-power dissipated to the electrodes: 200 W; Exposure time: 5 minutes. After the plasma treatment, the RF plasma chamber was pumped down to remove leftover reactive species.

Without breaking vacuum, covalent attachment of the epichlorohydrin molecules was performed by introducing the epichlorohydrin vapors over the plasma-treated surface under vacuum (pressure of epichlorohydrin: 1 Torr; reaction time: 30 minutes). After this step, the remaining epichlorohydrin was vented and the chamber pressure brought up to atmosphere.

The deposition of the oligonucleotides onto the surface was done using an Eppendorf hand pipette capable of depositing 0.5 microliter spots. The quartz surface was spotted in nine places using the amine-terminated oligonucleotides. The sample was allowed to react in a dark, dry environment for 2 hours. It was then washed to remove unbound oligonucleotides.

Figure 6:
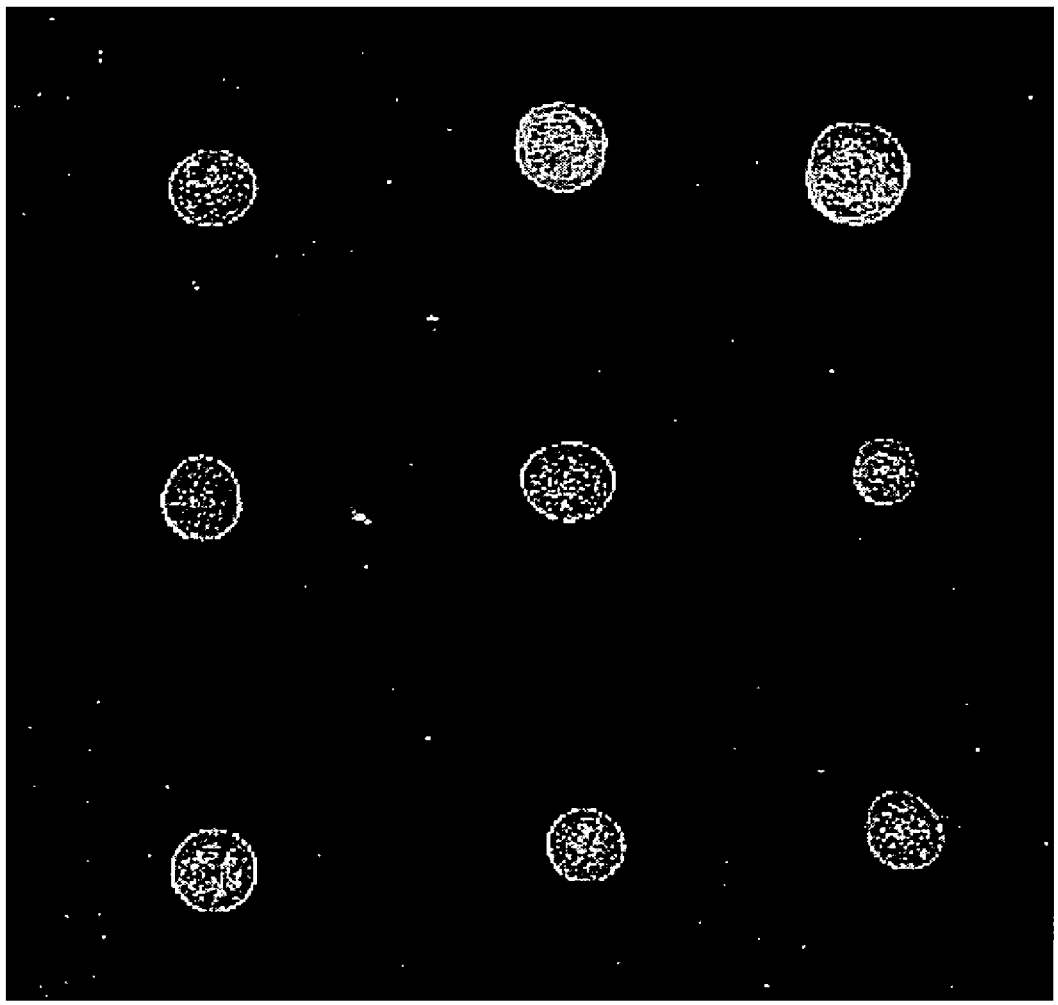
FIG. 6 shows a fluorescence image of fluorescently-tagged oligonucleotides immobilized on a quartz surface.

Results:

A scan of the treated quartz surface is presented below in FIG. 6. In the figure, the fluorescence spots corresponding to immobilized amine-terminated oligonucleotides are clearly visible.

Example 4

Attachment of DNA to an Oxidized Silicon Surface

Materials and Methods:

A silicon wafer with a native oxide surface obtained from Polishing Corporation of America (Santa Clara, Calif.) was subjected to a water/oxygen plasma treatment under the following experimental conditions: Pressure of water and oxygen: 200 mTorr; RF-power dissipated to the electrodes: 200 W; Exposure time: 5 minutes. After the plasma treatment, the RF plasma chamber was pumped down to remove leftover reactive species.

Without breaking vacuum, covalent attachment of the epichlorohydrin molecules was performed by introducing the epichlorohydrin vapors over the plasma-treated surface under vacuum (pressure of epichlorohydrin: 1 Torr; reaction time: 30 minutes). After this step, the remaining epichlorohydrin was vented and the chamber pressure brought up to atmosphere.

The deposition of the oligonucleotides onto the surface was done using an Eppendorf hand pipette capable of depositing 0.5 microliter spots. The oxidized silicon surface was spotted in five places using the amine-terminated oligonucleotides. The sample was allowed to react in a dark, dry environment for 2 hours. It was then washed to remove unbound oligonucleotides.

Figure 7:
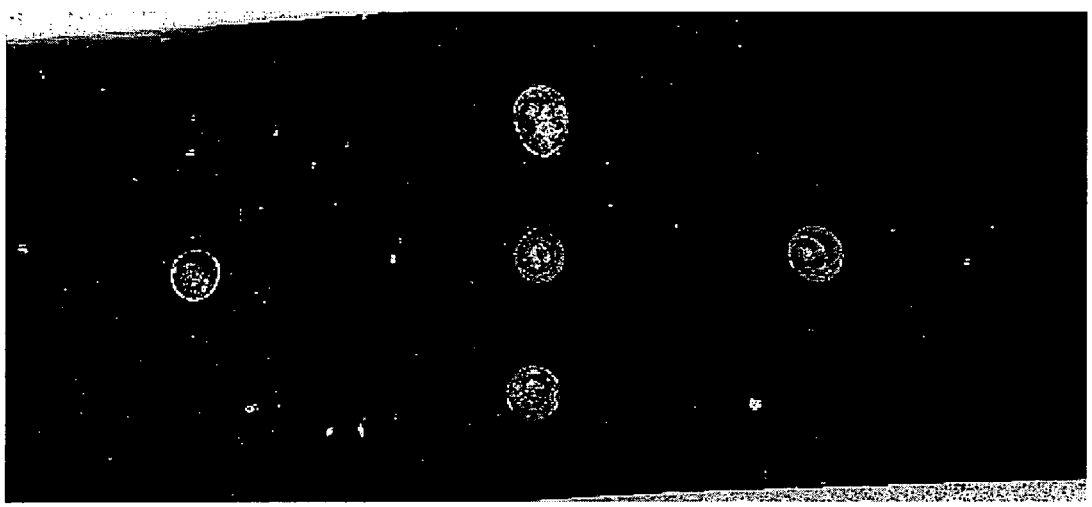
FIG. 7 shows a fluorescence image of fluorescently-tagged oligonucleotides immobilized on the native oxide present on a piece of silicon.

Results:

A scan of the treated oxidized silicon surface is presented below in FIG. 7. In the figure, the fluorescence spots corresponding to immobilized amine-terminated oligonucleotides are clearly visible.

Example 5

Hybridization Assay Using DNA Attached to a Glass Surface

Using the procedure described in Example 3, oligonucleotides 31 bases long with a C6-modifier on the 5' end were covalently bound to a glass slide. The sequence of these oligonucleotides was amino-C6-TT TTT TTT TTT TTT TGC TTA AGG AAG GTT CG. The oligonucleotides were deposited in nine spots on the surface. The sample was allowed to react in a dry dark environment for 2 hours. The surface was then blocked with ethanolamine and washed to remove unbound oligonucleotides. The surface-bound oligonucleotides were then exposed to a solution containing complimentary oligonucleotides having a fluorescein modifier on their 5' end. The sequence of the complements was fluorescein-CG AAC CTT CCT TAA GC. The complementary oligonucleotides were diluted to a 200 μM concentration in a 2×SSPE/0.2% SDS buffer solution for the hybridization. Hybridization was carried out at room temperature for 2 hours, followed by a rinse in 2×SSPE/0.2% SDS for an hour to remove nonhybridized complements.

The oligonucleotides were synthesized by the University of Wisconsin Biotechnology Center using a commercial DNA synthesizer.

Figure 8:
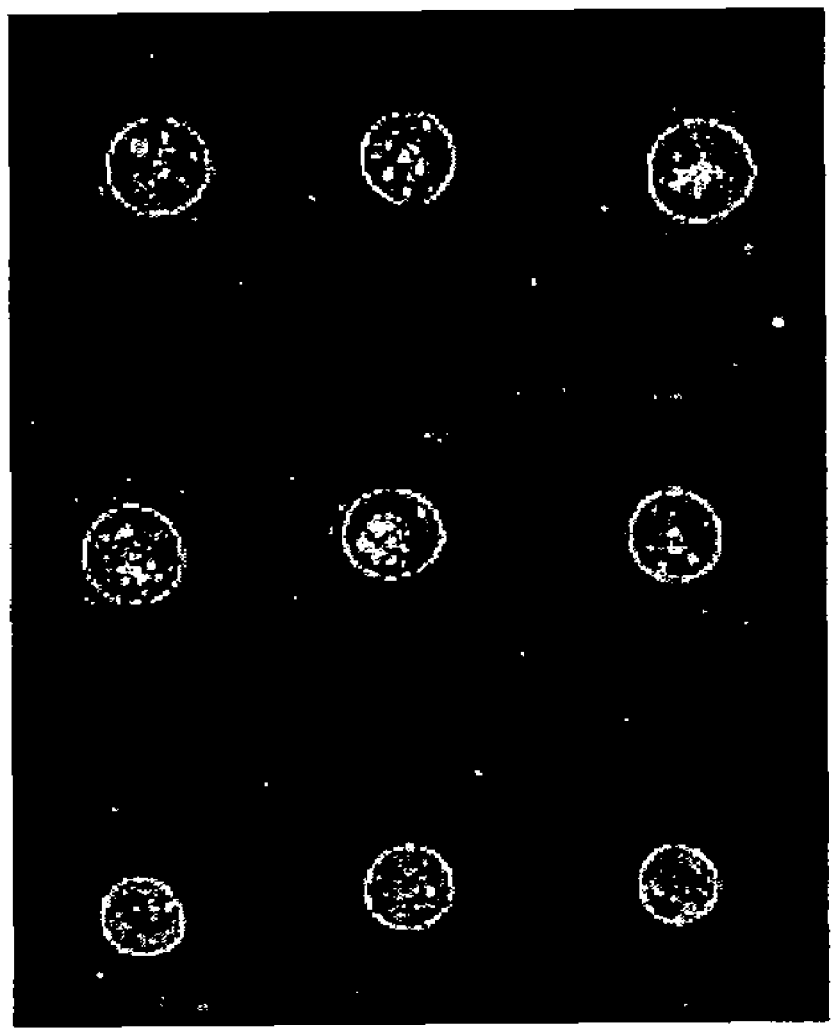
FIG. 8 shows a fluorescence image of fluorescently-tagged oligonucleotides hybridized to complimentary oligonucleotides immobilized on a glass surface.

A scan of the hybridization assay is shown in FIG. 8. In the figure, fluorescence signal from the hybridized oligonucleotides is clearly visible.

Example 6

Attachment of DNA to a Glass Substrate with an Extended Spacer Chain

This example describes the formation of an extended spacer chain through sequential gas phase chain extension reactions.

A standard glass slide was subjected to a water/oxygen plasma treatment in the RF plasma reactor under the following experimental conditions: Pressure of water and oxygen: 200 mTorr; RF-power dissipated to the electrodes: 200 W; Exposure time: 3 minutes. After the plasma treatment, the RF plasma chamber is pumped down to remove leftover reactive species.

Without breaking vacuum, covalent attachment of the epichlorohydrin molecules was performed by introducing epichlorohydrin vapors over the plasma-treated surface under vacuum (pressure of epichlorohydrin: 1 Torr; reaction time:

30 minutes). After this step, the chamber was pumped down to remove any remaining epichlorohydrin. Next, without breaking vacuum, ethylenediamine vapors were introduced into the chamber (pressure of ethylenediamine: 1 Torr; reaction time: 30 minutes). The chamber was then pumped down again. This two-step procedure was repeated one more time by reintroducing epichlorohydrin vapors into the chamber, pumping down the chamber, then reintroducing ethylenediamine into the chamber, and pumping down once more. Finally, the spacer chains were terminated by introducing epichlorohydrin vapors into the chamber one final time. The remaining epichlorohydrin was then vented and the chamber pressure was brought up to atmosphere. The resulting spacer chains were at least 2.5 nm in length. In a variation of the procedure, the spacer chains were extended further by repeating the two step procedure one additional time before terminating the chains with epichlorohydrin. The resulting spacer chains were at least 5 nm in length.

Next oligonucleotides were deposited onto the 2.5 nm long spacer chains using an Eppendorf hand pipette capable of depositing 0.5 microliter spots. The sequence of these oligonucleotides was amino-C6-GC TTA AGG AAG GTT CG. The oligonucleotides were deposited in nine spots on the surface. The samples were allowed to react in a dark, dry environment for 2 hours. The surface was then blocked with ethanolamine and then washed to remove unbound oligonucleotides.

These surface-bound oligonucleotides were then exposed to a solution containing complimentary oligonucleotides having a fluorescein modifier on their 5' end. The sequence of the complements was fluorescein-CG AAC CTT CCT TAA GC. The complementary oligonucleotides were diluted to a 200 µM concentration in a 2×SSPE/0.2% SDS buffer solution for the hybridization. Hybridization was carried out at room temperature for 2 hours, followed by a rinse in 2×SSPE/0.2% SDS for an hour to remove nonhybridized complements.

The oligonucleotides were synthesized by the University of Wisconsin Biotechnology Center using a commercial DNA synthesizer.

Figure 9:
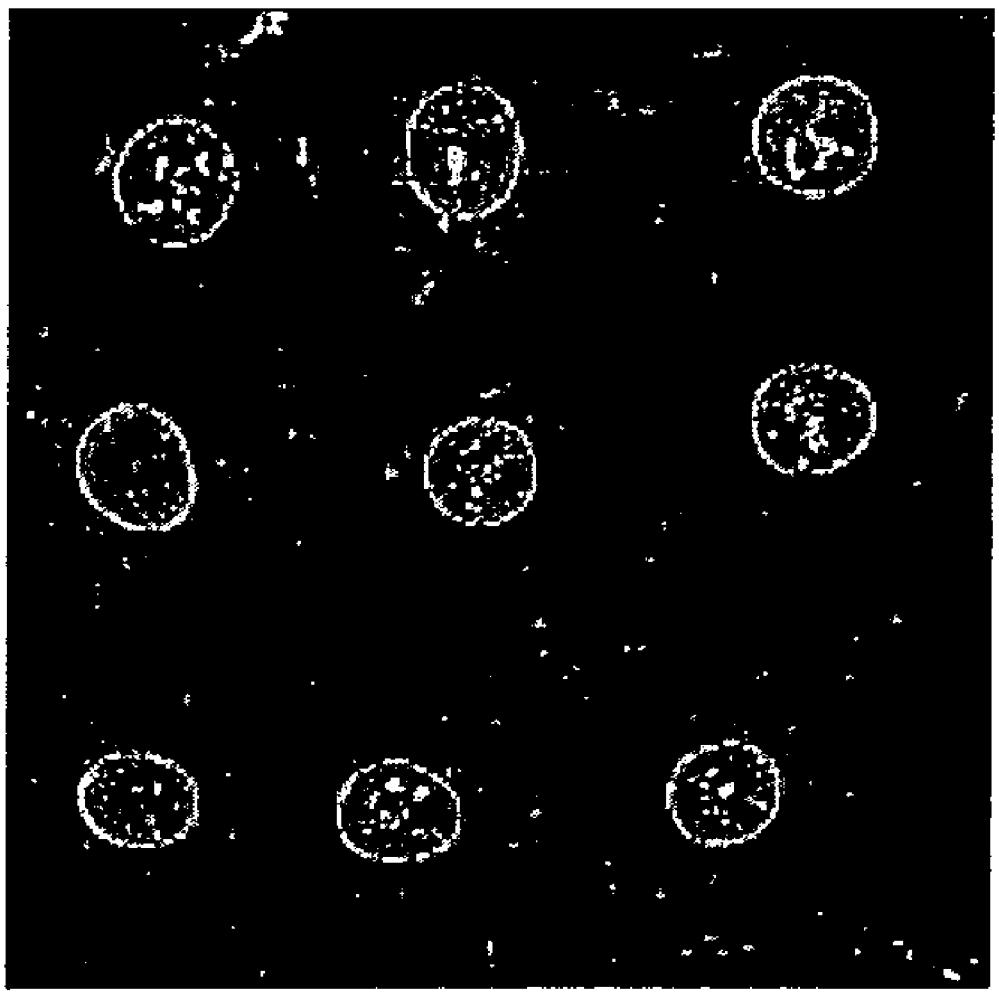
FIG. 9 shows a fluorescence image of fluorescently-tagged oligonucleotides hybridized to complimentary oligonucleotides. The complementary oligonucleotides are immobilized on a glass surface via extended spacer chains.

A scan of the hybridization assay is shown in FIG. 9. In the figure, fluorescence signal from the hybridized oligonucleotides is clearly visible.

It is understood that the invention is not limited to the embodiments set forth herein for illustration, but embraces all such forms thereof as come within the scope of the following claims.

What is claimed is:

1. A method of treating a surface of a substrate, the method comprising:
    (a) forming hydroxyl groups on an oxide surface by exposing the oxide surface to a plasma;
    (b) reacting epoxy groups on epihalohydrin molecules with the surface hydroxyl groups in situ in the absence of plasma and in the absence of acid and base catalysts to provide a functionalized surface; and
    (c) exposing the functionalized surface to vacuum in situ to provide epoxy-terminated, surface-bound spacer chains.

2. The method of claim 1, wherein the epihalohydrin molecules are epichlorohydrin molecules.

3. The method of claim 1, wherein the oxide surface comprises a silicon oxide.

4. The method of claim 3, wherein the oxide surface comprises silica, glass or quartz.

5. The method of claim 1, wherein the oxide surface comprises a metal oxide.

6. The method of claim 5, wherein the metal oxide comprises a native oxide of stainless steel.

7. The method of claim 1, wherein the plasma is formed from a source gas comprising water, oxygen or a mixture thereof.

8. The method of claim 1, further comprising immobilizing biomolecules on the oxide surface by reacting the biomolecules with the oxide surface-bound spacer chains.

9. The method of claim 1, further comprising extending the spacer chains by reacting the spacer chains with gas-phase spacer molecules in situ in the absence of plasma to provide extended spacer chains.

10. The method of claim 8, wherein the biomolecules are amine-functionalized or amine-containing biomolecules.

11. The method of claim 8, wherein the biomolecule is selected from the group consisting of oligonucleotides, aptamers, cDNA and RNA.

12. The method of claim 8, wherein the biomolecule is a protein.

13. The method of claim 9, wherein the spacer molecules comprise an amine group capable of reacting with the epoxy functionality of the spacer chains.

* * * * *